(12) United States Patent
Archer

(10) Patent No.: US 7,639,077 B2
(45) Date of Patent: Dec. 29, 2009

(54) METHOD AND APPARATUS FOR PRE-CONDITIONING AN ELECTRICAL SIGNAL

(75) Inventor: Nicholas Archer, Ilkely (GB)

(73) Assignee: Filtronic PLC, West Yorkshire (GB)

( * ) Notice: Subject to any disclaimer, the term of this patent is extended or adjusted under 35 U.S.C. 154(b) by 106 days.

(21) Appl. No.: 11/662,317

(22) PCT Filed: Sep. 8, 2005

(86) PCT No.: PCT/GB2005/003458
§ 371 (c)(1),
(2), (4) Date: Mar. 14, 2008

(87) PCT Pub. No.: WO2006/027583
PCT Pub. Date: Mar. 16, 2006

(65) Prior Publication Data
US 2009/0015325 A1   Jan. 15, 2009

(30) Foreign Application Priority Data
Sep. 8, 2004   (GB) ................................ 0419905.5

(51) Int. Cl.
*H03F 1/26* (2006.01)
(52) U.S. Cl. ........................ 330/149; 330/2; 455/114.3; 375/297
(58) Field of Classification Search .................. 330/149, 330/2; 455/114.3; 375/297
See application file for complete search history.

(56) References Cited

U.S. PATENT DOCUMENTS

| | | | |
|---|---|---|---|
| 6,396,344 B1 * | 5/2002 | Gentzler et al. ............. | 330/149 |
| 6,504,862 B1 | 1/2003 | Yang | |
| 6,809,587 B2 * | 10/2004 | Ghannouchi et al. ........ | 330/149 |
| 6,812,792 B2 * | 11/2004 | Mattsson et al. ............ | 330/149 |
| 6,922,103 B2 * | 7/2005 | Cheung et al. .............. | 330/149 |
| 7,187,234 B2 * | 3/2007 | Cavers et al. ............... | 330/149 |
| 7,474,149 B2 * | 1/2009 | Snelgrove et al. ........... | 330/136 |
| 2003/0043895 A1 | 3/2003 | Melsa | |
| 2004/0130394 A1 | 7/2004 | Mattsson et al. | |

FOREIGN PATENT DOCUMENTS

WO   WO 02089315 A2   11/2002
WO   WO 2006027583 A1   3/2006

OTHER PUBLICATIONS

International Search Report dated Nov. 9, 2005 for International Application No. PCT/GB2005/003458.

* cited by examiner

*Primary Examiner*—Patricia Nguyen
(74) *Attorney, Agent, or Firm*—Howard & Howard Attorneys PLLC

(57) ABSTRACT

Iterative pre-conditioning of an electrical signal for supply to an amplifier, comprising: a first pre-conditioning iteration comprising limiting the amplitude of the electrical signal to produce a limited signal; generating a difference signal for subtracting the electrical signal from the limited signal; and generating an output signal by subtracting the difference signal from the limited signal; at least one further iteration comprising the steps of: Limiting the amplitude of the output signal of the previous iteration to produce a subsequent limited signal; generating a subsequent difference signal by subtracting the electrical signal from the subsequent limited signal; and generating an output signal by subtracting the subsequent difference signal from the subsequent limited signal.

17 Claims, 4 Drawing Sheets

METHOD AND APPARATUS FOR PRE-CONDITIONING AN ELECTRICAL SIGNAL

The subject patent application claims priority to and all the benefits of International Application No. PCT/GB2005/003458, which was filed on 8 Sep. 2005 with the World Intellectual Property Organization.

The present invention relates to a method and apparatus for pre-conditioning an electrical signal. More particularly, the present invention relates to a method and apparatus for pre-conditioning an electrical signal to compensate for the effect of a non-linear amplifier on the signal.

An amplifier tends to exhibit substantially linear response to an input signal only over a limited range. When an input signal has a large variation in amplitude, the amplifier generates distortion in the output signal, as a result of its non-linear behaviour, for those parts of the input signal exceeding a signal level corresponding to the onset of substantial non-linear behaviour.

This problem can be addressed by producing an amplifier with linear behaviour over an extended range. However, to ensure that significant distortion will not be generated, it is necessary to know the maximum input signal strength, so as to be sure that the amplifier range is sufficient.

Alternatively, the output of the amplifier can be filtered, but in some applications, the distortion levels permitted by systems specifications can mean it is not practicable technologically to produce a filter meeting the required filter characteristic.

WO 02/089315 discusses a method of pre-conditioning an electrical signal by limiting the amplitude of a signal prior to amplification. The method includes limiting a signal and then subtracting the difference between the non-limited and the limited signal, to produce an output pre-conditioned signal. The method results in a signal in which the amplitude of peaks of in the signal is limited, but the amplitude of the signal below the limiting value remains substantially the same. This has the effect of increasing the spectral weight of the input signal away from the signal band of interest. WO 02/089315 mentions that a filter can be used to suppress the out-of-band signal to within tolerable limits. However, it can be difficult to design a suitable filter to suppress the out-of-band signal sufficiently. WO 02/089315 also mentions that the method can be iterated to improve convergence. It teaches that subsequent stages have a single input of the output from the preceding stage, and carry out the same method. However, several iterations may be required to converge the signal to an acceptable level, with consequent adverse effects on the processing power and power consumption of the device. Furthermore, errors can propagate from one iteration to the next.

The present invention seeks to improve the performance of iterative electrical signal preconditioning.

According to a first aspect of the present invention, there is provided a method of iteratively pre-conditioning an electrical signal for supply to an amplifier, the method comprising:
  performing a first pre-conditioning iteration comprising the steps of:
    limiting the amplitude of the electrical signal to produce a limited signal;
    generating a difference signal for subtracting the electrical signal from the limited signal; and
    generating a difference signal by subtracting the electrical signal from the limited signal;
  performing at least one further iteration comprising the steps of:
    limiting the amplitude of the output signal of the previous iteration to produce a subsequent limited signal;
    generating a subsequent difference signal by subtracting the electrical signal from the subsequent limited signal; and
    generating an output signal by subtracting the subsequent difference signal from the subsequent limited signal.

It will be appreciated that subtraction is merely addition of a negative quantity, and therefore the references to subtraction include addition of a negative quantity.

By using the original input signal to generate the difference signal throughout all stages of the iteration, rather than the output of the previous stage, errors do not accumulate as the signal is iterated and the signal converges quickly.

Preferably, at least one iteration includes a step of filtering the difference signal before generating the output signal.

Preferably, if an iteration includes said step of filtering the difference signal, the iteration further includes a step of delaying the limiting signal to allow for the delay introduced by the filtering step.

Preferably, at least two iterations include a step of filtering and the filter characteristics vary between iterations.

Preferably, the amplitude of the limited signal generated in at least one iteration is dependent upon the amplitude of the electrical signal to be pre-conditioned. The amplitude of the limited signal is used to refer to the amplitude above which the amplitude of the signal is limited, or the maximum amplitude of the limited signal.

Preferably, the amplitude of the limited signal is set at a value to prevent the pre-conditioned signal amplitude from exceeding the signal amplitude corresponding to the onset of substantial non-linear response.

Preferably, the amplitude of the limited signal varies between iterations.

Preferably, the electrical signal is a telecommunications signal for broadcast.

According to a second aspect of the present invention, there is provided an electrical circuit for pre-conditioning an electrical signal for supply to an amplifier, the circuit comprising:
  a first iteration section comprising:
    a limiter for limiting the amplitude of the electrical signal to produce a limited signal;
    means for generating a difference signal by subtracting the electrical signal from the limited signal; and
    means for generating an output signal by subtracting the difference signal from the limited signal;
  and at least one subsequent iteration section comprising:
    a limiter for limiting the amplitude of the output signal of the previous iteration to produce a subsequent limited signal;
    means for generating a subsequent difference signal by subtracting the electrical signal from the subsequent limited signal; and
    means for generating a subsequent output signal by subtracting the subsequent difference signal from the subsequent limited signal.

Preferably, the components of the circuit are implemented by a digital signal processor.

Preferably, the circuit comprises a plurality of subsequent iteration sections connected in series.

Preferably, at least one of the iteration sections comprises a filter for filtering the difference signal before generating the output signal.

Preferably, if an iteration section comprises a filter, that iteration section further comprises a delay element to allow for the delay introduced by the filter.

Preferably, at least two iteration sections comprise a filter, and the filter characteristics vary between each section.

Preferably, the amplitude of the limited signal varies between iterations.

According to a third aspect of the invention, there is provided a telecommunications apparatus, including a pre-conditioning circuit according to the second aspect of the invention, and an amplifier for amplifying the pre-conditioned signal.

Preferably, the apparatus includes a pre-distorter which pre-distorts the pre-conditioned signal prior to amplification and a filter which filters the output of the amplifier.

An embodiment of the invention will now be described, by way of example only, and with reference to the accompanying drawings, in which.

Figure 1:
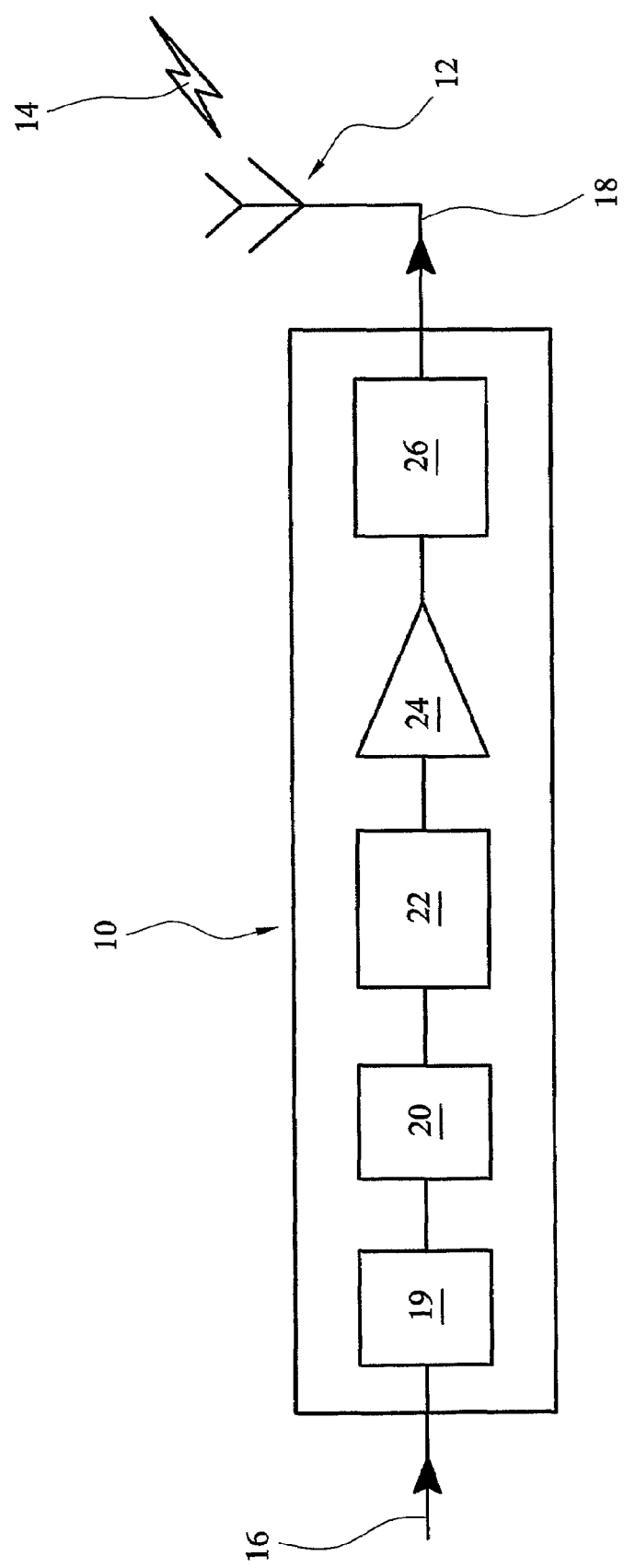
FIG. 1 shows a schematic block diagram of the transmit part of a telecommunications base-station including circuitry operating according to the method of the present invention.

Similar items in different Figures share common reference numerals unless indicated otherwise.

With reference to FIG. 1 there is shown a schematic representation of a base-station 10 for a telecommunications system connected to an antenna 12 for broadcasting electromagnetic telecommunication signals 14. The base-station 10 includes transmit and receive parts. FIG. 1 shows the transmit parts relevant to describing the invention only. The other conventional parts of the base-station have not been shown for the sake of clarity only.

The transmits part of the base-station 10 includes a number of electronic devices for processing an input electrical signal 16 into an output electrical signal 18 for supply to the broadcast antenna 12 for transmission. The base-station includes a modulator 19, a pre-conditioning device 20, a pre-distortion device 22, a power amplifier 24 and a filter 26.

The signal processing components of the base-station are suitable for processing electrical telecommunication signals employing amplitude modulation encoding or complex encoding: i.e. amplitude and phase modulation. The following discussion will focus on a telecommunications system utilising the CDMA encoding scheme, although the circuitry and method described are applicable to any electrical signal with amplitude modulation having a high peak power to average power ratio. This is often referred to as peak to average or peak to mean ratio.

Modulator 19 is substantially conventional and handles other functions of the transmit part of the base-station prior to the pre-conditioning stage. Pre-distortion stage 22 is of substantially conventional design and the application of a pre-distortion stage to improve the linear behaviour of a non-linear amplifier is well understood in this art.

Amplification stage 24 is a conventional power amplifier which exhibits a substantially linear response up to an input signal power level after which significant non-linear response is exhibited. Filter stage 26 is a substantially conventional design high power RF filter. However, the filter characteristic of the filter 26 will be determined by the telecommunications scheme under which the base-station operates so as to provide an acceptable level of distortion out of the telecommunications signal band over which the telecommunications signal 14 is being broadcast.

For example, under a current CDMA scheme, a GHz part of the broadcast spectrum is divided into bands, with each band having a substantially 5 MHz width and each broadcaster must not generate distortion in neighbouring bands above levels defined as acceptable by the telecommunications standards in force at the time. Hence, the filter characteristic of filter 26 is selected to ensure that the out of band distortion reaches the telecommunications standard criterion.

Figure 2:
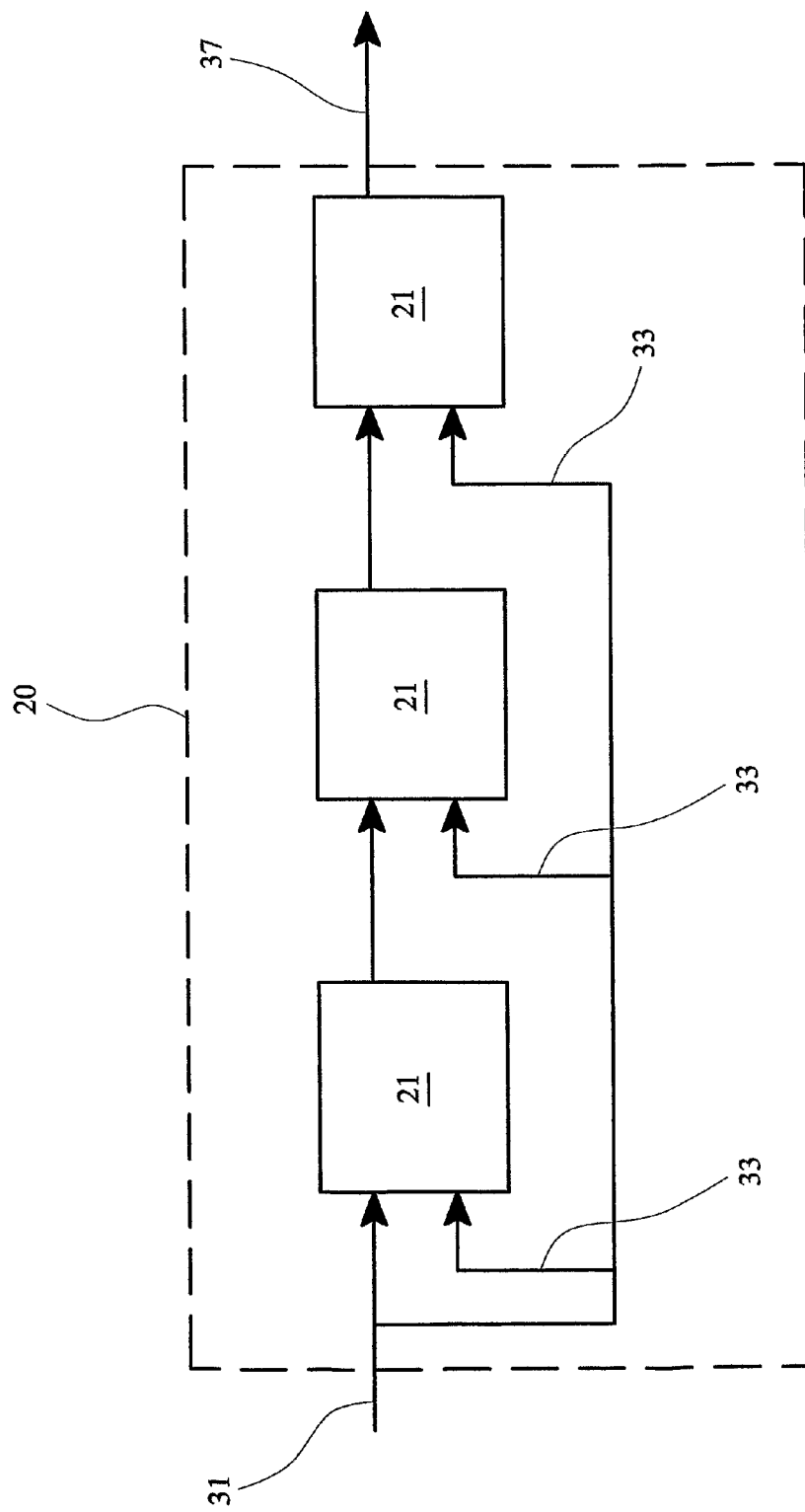
FIG. 2 shows a schematic functional block diagram of an electronic circuit according to the present invention.

FIG. 2 shows a schematic functional block diagram of the signal pre-conditioning stage 20. The pre-conditioning circuitry 20 is implemented by a digital signal processor.

FIG. 2 shows an iterative signal pre-conditioner with 3 stages 21. Each stage 21 is provided with an input reference signal 33. The reference signal 33 is the same as the input signal 16 with no signal processing applied. Each stage 21 also has a further input fed with the output of the previous stage or, in the case of the first stage, the original input signal.

Figure 3:
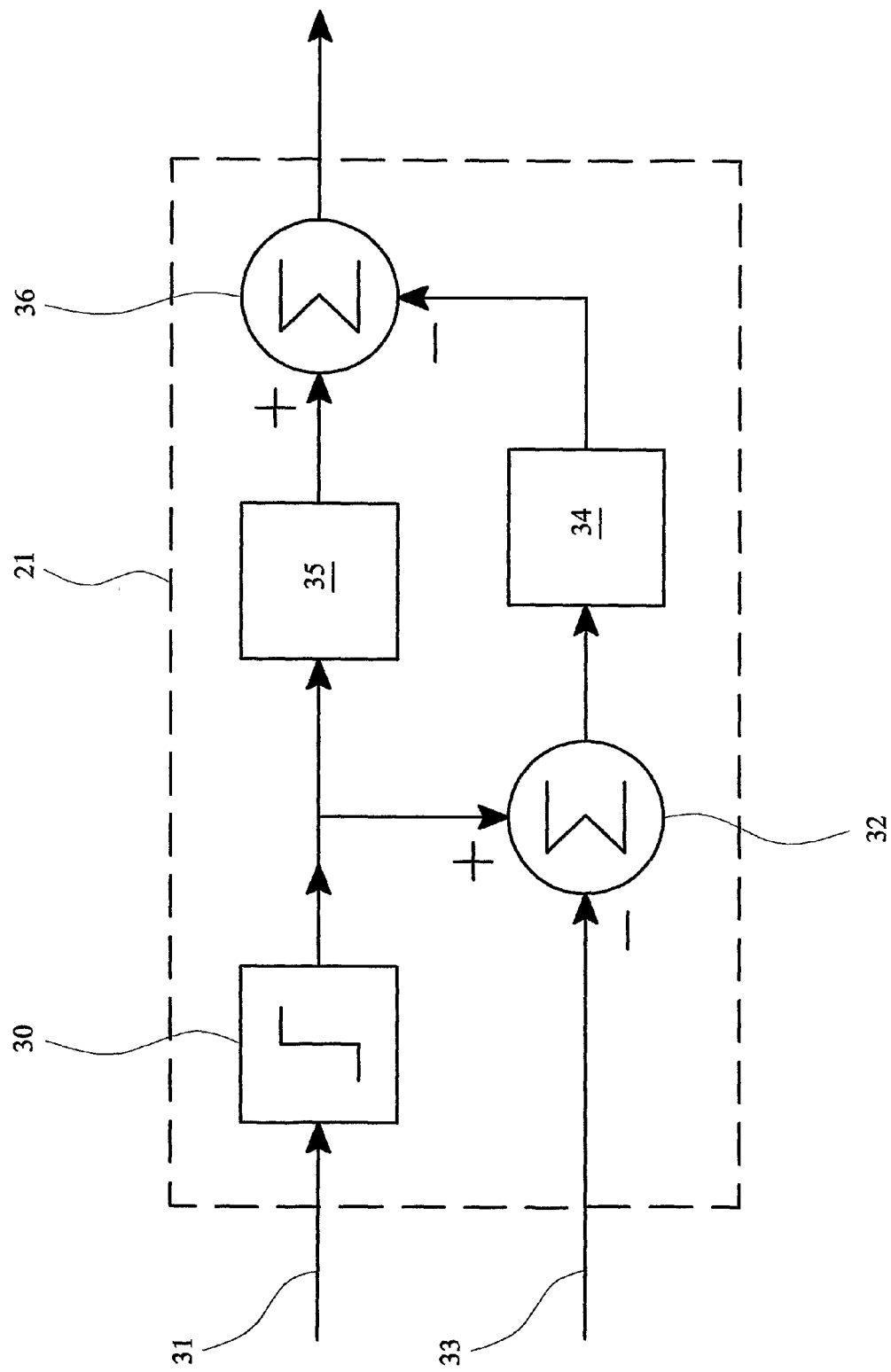
FIG. 3 shows a schematic functional block diagram of parts of an electronic circuit according to the present invention.

FIG. 3 is a schematic diagram of the circuitry to implement each iteration 21, it illustrates the functionality supported by the digital signal processor and should be read accordingly. The iteration circuitry includes a limiter or clipper component 30 which limits or clips the amplitude of an electrical signal to a maximum value. An input electrical telecommunications signal 31 is supplied as an input to limiter 30 and a limited or clipped signal is output therefrom.

The iteration circuitry also includes a combining component 32 to which the reference signal 33 and the limited signal are supplied. The combining component 32 subtracts the reference signal 33 from the limited signal. It will be appreciated that a subtracting function is merely a matter of sign convention and that adding a negative quantity is equivalent to subtracting a positive quantity. A filter 34 is also provided to which the difference signal output from the combining component is supplied. A delay element 35 introduces a delay into the limited signal which corresponds to the delay introduced into the difference signal by the filter. Finally, the circuitry includes a further combining component 36 to which the delayed limited signal and the filtered difference signal are supplied. Combining component 36 subtracts the filtered difference signal from the delayed limited signal, subtraction again being a matter of sign convention, and generates an output signal 37.

The output signal 37 is supplied as one input to the next iterative stage, together with the original input signal as a reference. The output from the third stage forms the pre-conditioned signal.

In general, the characteristics of filter 34 will be determined by the application of the pre-conditioning circuitry and method. The filter 34 is used to select the part of the spectrum that will be used to correct the limited signal by the final summation stage 36. The filter may have arbitrary positioning of the passbands with arbitrary width confined only by the amount of energy contained in the difference signal. The amplitude of the difference signal determines how much the pre-conditioned output signal will exceed the original limit.

The passbands of the filter 34 are chosen to optimize the final pre-conditioned signal with respect to the various in-band and out-of-band specifications. The optimal solution will be one where all the specifications are equally well met.

If one specification is harder to meet than another, then correction can be concentrated on that specification, so that the amplifier may be driven harder while still meeting all the specifications. In this particular example, the out-of-band distortion specification is harder to meet and so is corrected at the expense of distortion elsewhere: in band, in this case. The opposite can be required and attained; ie the in-band distortion can be improved at the expense of the out-of-band distortion, if that is required by the specifications of a particular application. The exact design of the filter characteristics is a careful optimization and will depend on the signal to be pre-conditioned and the specifications. It will be appreciated that the characteristics of the filter can be different in each iteration.

An adaptive clipping function can also be provided in which the clipping limit is set dependent on the amplitude of the input signal. The strength of the input signal 31 is measured to determine the amount by which it exceeds a signal strength corresponding to the onset of substantial non linear behaviour by the amplifier. The amount by which the input signal exceeds that level is then used to set the actual clipping level so that the more the input signal exceeds the onset strength, the lower the clipping level actually used to clip the signal. This can be used to ensure that the output of the pre-conditioned signal falls below the actual signal level corresponding to the onset of substantial non-linear behaviour by the amplifier. The actual clipping level to be used can be determined by a calculation, using a formula stored in memory, or from a look up table stored in memory from experimental results.

The adaptive clipping feature and iteration feature can be combined so that the actual clipping level used can be changed for each iterative step.

In one alternative embodiment, the filter 34 in the first iteration can be of a simple design, with later iterations using more complex filters. This is because the later iterations will correct any errors introduced by the simpler filter. In this embodiment, the complexity of the construction and design of the preconditioning circuit is reduced.

Although the illustrative embodiment has 3 iterations, the invention can be operated with any number of iterations, from 2 upwards.

Although the method and apparatus have been described within the context of a telecommunications system, it will be appreciated that the pre-conditioning method and circuitry of FIGS. 2 and 8 can be used to pre-condition any electrical signal having a high peak to average ratio which is to be amplified, in order to reduce non-linear amplifier related distortion adjacent the amplified signal of interest. The method and circuitry are applicable to any amplitude modulated electrical signal, including complexly modulated signals in which both amplitude and phase are used to encode information.

Although the above description of the invention has been in the context of a digital signal processing implementation at baseband, the preconditioning signal processing could be carried out using analogue components at baseband, some intermediate frequency (IF), or even radio frequency (RF).

Figure 4:
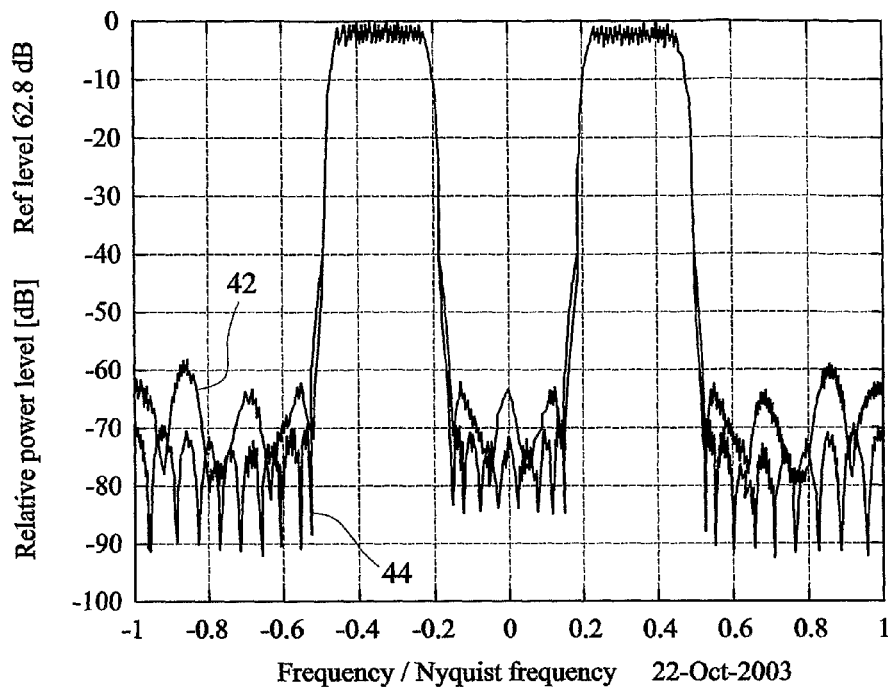
FIG. 4 shows a graph of the baseband spectra of a WCDMA signal pre-conditioned according to the present invention compared with the known iterative method discussed in WO 02/089315.

The present invention produces a cleaner spectrum with consequent improved signal characteristics than previous iterative methods. FIG. 4 shows a baseband spectrum of a third generation mobile telephone signal, specifically a 2-tone WCDMA (Wideband Code Division Multiple Access) to which 2 iterations of the pre-conditioning method of the present invention and the method described in WO 02/089315 were applied. Spectrum 44 corresponds to the present invention, and spectrum 42 corresponds to the method described in WO 02/089315. There is significantly reduced power at frequencies away from the desired signal. Thus, the method of the present invention offers greater performance for the same amount of signal processing than the iterative method of WO 02/089315.

Figure 5:
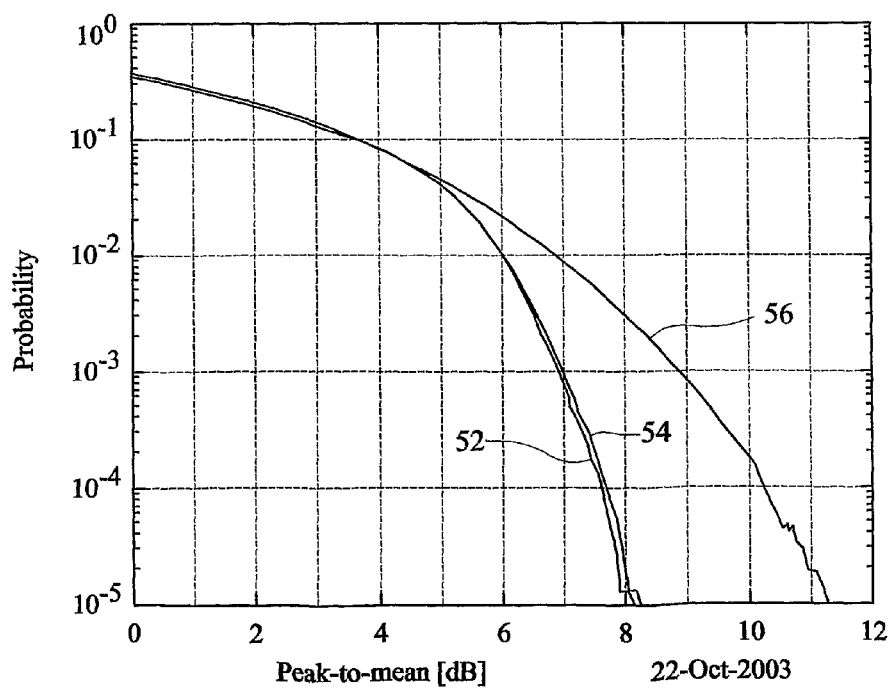
FIG. 5 shows a graph of the CCDF of a WCDMA signal pre-conditioned according to the present invention and compared with the original signal and the known iterative method of WO 02/089315.

FIG. 5 shows the reduction in peak-to-mean for the same signals. It is a plot of the CCDF (complementary-cumulative-distribution function) and indicates the probability that the signal exceeds a specified power threshold. The figure shows that there is substantially no difference in the peak-to-mean between the method of the present invention (line 54) and that of WO 02/089315 (line 52). The present invention also represents a significant improvement over the original signal (line 56) without pre-conditioning applied.

As a measure of the in-band distortion, the composite error vector magnitude (EVM) was to tested using an Agilent ESG-D4433 signal generator and an Agilent E4406A VSA signal analyser for a single carrier. EVM is the difference between the received demodulated signal and the ideal signal as a percentage of amplitude. To within the accuracy of the test equipment, there was no difference between the method of the present invention and the method of WO 02/089315. Both methods gave a result of 6.6% average EVM.

In conclusion, the method of the present invention produces a cleaner output spectrum, with no deterioration in peak-to-mean and EVM performance over the method of WO 02/089315.

The invention claimed is:

1. A method of iteratively pre-conditioning an electrical signal for supply to an amplifier, the method comprising:
   performing a first pre-conditioning iteration comprising the steps of:
      limiting an amplitude of the electrical signal to produce a limited signal;
      generating a difference signal by subtracting the electrical signal from the limited signal; and
      generating an output signal by subtracting the difference signal from the limited signal;
   performing at least one further iteration comprising the steps of:
      limiting the amplitude of the output signal of the previous iteration to produce a subsequent limited signal;
      generating a subsequent difference signal by subtracting the electrical signal from the subsequent limited signal; and
      generating a subsequent output signal by subtracting the subsequent difference signal from the subsequent limited signal.

2. A method as claimed in claim 1, wherein at least one iteration includes a step of filtering the difference signal before generating the output signal.

3. A method as claimed in claim 2, wherein if an iteration includes said step of filtering the difference signal, the iteration further includes a step of delaying the limiting signal to allow for the delay introduced by the filtering step.

4. A method as claimed in claim 2, wherein at least two iterations include a step of filtering and the filter characteristics vary between iterations.

5. A method as claimed in claim 1, wherein the amplitude of the limited signal generated in at least one iteration is dependent upon the amplitude of the electrical signal to be pre-conditioned.

6. A method as claimed in claim 1, wherein in at least one iteration the amplitude of the limited signal is set at a value to prevent the pre-conditioned signal amplitude from exceeding the signal amplitude corresponding to the onset of substantial non-linear response.

7. A method as claimed in claim 1, wherein the amplitude of the limited signal varies between iterations.

8. A method as claimed in claim 1, in which the electrical signal is a telecommunications signal for broadcast.

9. An electrical circuit for pre-conditioning an electrical signal for supply to an amplifier, the circuit comprising:
 a first iteration section comprising:
  a limiter for limiting an amplitude of the electrical signal to produce a limited signal;
  means for generating a difference signal by subtracting the electrical signal from the limited signal; and
  means for generating an output signal by subtracting the difference signal from the limited signal;
 and at least one subsequent iteration section comprising:
  a limiter for limiting the amplitude of the output signal of the previous iteration to produce a subsequent limited signal;
  means for generating a subsequent difference signal by subtracting the electrical signal from the subsequent limited signal; and
  means for generating a subsequent output signal by subtracting the subsequent difference signal from the subsequent limited signal.

10. A circuit as claimed in claim 9, in which the components of the circuit are implemented by a digital signal processor.

11. A circuit as claimed in claim 9, comprising a plurality of subsequent iteration sections connected in series.

12. A circuit as claimed in claim 9, wherein at least one of the iteration sections comprises a filter for filtering the difference signal before generating the output signal.

13. A circuit as claimed in claim 12, wherein if an iteration section comprises a filter, that iteration section further comprises a delay element to allow for the delay introduced by the filter.

14. A circuit as claimed in claim 12, wherein at least two iteration sections comprise a filter, and the filter characteristics vary between each section.

15. A circuit as claimed in claim 9, wherein the amplitude of the limited signal varies between iterations.

16. A telecommunications apparatus, including a pre-conditioning circuit as claimed in claim 9, and an amplifier connected to an output of the first iteration section for amplifying the pre-conditioned electrical signal.

17. An apparatus as claimed in claim 16, and including a pre-distorter which pre-distorts the pre-conditioned electrical signal prior to amplification and a filter which filters the output signal of the amplifier.

* * * * *